May 5, 1970 F. G. ERNICK ETAL 3,510,369

SELECTIVE DIFFUSION MASKING PROCESS

Filed March 18, 1968 2 Sheets-Sheet 1

WITNESSES

Theodore F. Wrobel

Donald M. Winegar

INVENTORS
Frederick G. Ernick and
Paul M. Kisinko

BY

C. L. Menzemer

ATTORNEY 3,510,369

SELECTIVE DIFFUSION MASKING PROCESS

Frederick G. Ernick, Latrobe, and Paul M. Kisinko, Greensburg, Pa., assignors to Westinghouse Electric Corporation, Pittsburgh, Pa., a corporation of Pennsylvania

Continuation-in-part of application Ser. No. 612,242, Jan. 27, 1967. This application Mar. 18, 1968, Ser. No. 713,917
Int. Cl. H01l *7/44*
U.S. Cl. 148—187 9 Claims

ABSTRACT OF THE DISCLOSURE

This invention provides a selective diffusion masking process which permits the fabrication of planar devices on lapped surfaces of semiconductor materials. The process entails the growing of an epitaxial layer of silicon carbide and selective etching of the same to provide the diffusion mask where desired on the lapped surface.

This application is a continuation-in-part of application Ser. No. 612,242 filed Jan. 27, 1967.

BACKGROUND OF THE INVENTION

Field of invention

This invention relates to the employment of silicon carbide as a masking agent in diffusion processing of electrical device materials.

Description of prior art

In the planar technology for semiconductor device fabrication selective diffusion of a wafer of semiconductor material is accomplished through a thermally grown layer of silicon oxide. An important feature of this process is that the active device junction is always protected by the original silicon oxide layer.

In order to grow the necessary silicon oxide masking layer on the semiconductor wafer, the surface upon which the growth occurs must be polished. Silicon oxide grown thermally on a lapped surface is not an effective diffusion mask.

In some instances it is impossible to successfully mask against materials employed in diffusion processes. For an example, silicon oxide will not mask a wafer's polished surface from an ammonium phosphate diffusion.

SUMMARY OF THE INVENTION

An object of this invention is to provide a process for the diffusion of a selective region of a wafer of semiconductor material in which the masking layer is thermally deposited silicon carbide.

Another object of this invention is to provide a process for the diffusion of a selective region of a wafer of semiconductor material in which the masking layer is thermally deposited on a lapped surface of the wafer and comprises silicon carbide.

A further object of this invention is to provide a process for diffusing a selective region of a wafer of semiconductor material with phosphorus derived from an ammonium phosphate source wherein silicon carbide protects the undiffused region of the wafer.

Other objects of this invention will, in part, be obvious and will, in part, appear hereinafter.

In accordance with the present invention and in attainment of the foregoing objects, there is provided a selective diffusion process comprising masking a predetermined area of at least one surface of a body of semiconductor material with at least a layer of silicon carbide; and diffusing an impurity material through the unmasked area of the surface of said body to a predetermined depth to form a rectifying junction in said body.

DRAWINGS

For a better understanding of the nature and objects of the invention, reference should be had to the drawings in which FIGS. 1 through 11 are cross-sectional views of a body of semiconductor material being processed in accordance with the teachings of this invention.

DESCRIPTION OF INVENTION

Figure 1:
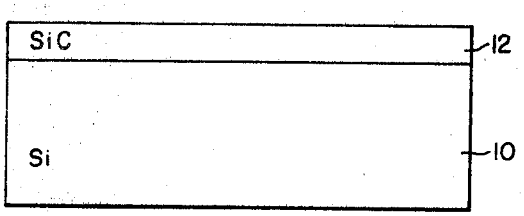

With reference to FIG. 1 there is shown a body 10 of semiconductor material upon which a layer 12 of silicon carbide has been thermally grown. The material comprising the body 10 may be silicon, germanium, compounds of Group III and Group V elements and compounds of Group II and Group VI elements.

The layer 12 of silicon carbide may be thermally grown on the body 10 by any suitable means known to those skilled in the art such, for example, as by the thermal decomposition of methylsilanes and halogenated methylsilanes mixed with a gas, such, for example, as nitrogen, argon, helium, neon, xenon and hydrogen. The surface of the body 10 upon which the silicon carbide is to be grown need only be lapped. The silicon carbide comprising the layer 12 may be either single crystal or polycrystalline material.

It has been found that a silicon carbide layer approximately 10,000 angstrom units in thickness is sufficient to act as a mask for most diffusant impurities. However, in the instance of diffusing phophorus into a wafer wherein the phosphorus is obtained from an ammonium phosphate source, a thickness of approximately 20,000 A. units is required.

Therefore in order to have a sufficient thickness of silicon carbide to be effective as a diffusion mask, the initial thickness of the layer 12 is important. Most diffusion processes are carried out in an oxidizing atmosphere. Therefore, the thickness of the layer 12 must be at least equal to the thickness of the oxidized silicon carbide layer which is formed during the diffusion process plus the thickness of silicon carbide to act as a diffusion mask plus the thickness converted to silicon oxide during selective etching of the layer 12. This is normally the only prerequisite for determining the thickness of the layer 12 which usually is approximately 10,000 angstrom units thick to act as an effective diffusion mask and approximately 10,000 angstrom units thickness to be converted to silicon oxide during the diffusion and selective etching processes. In diffusing phosphorus from ammonium phosphate transported by oxygen or nitrogen gas into the body 10 it has been found that the initial minimum thickness of the layer 12, to assure one of having approximately 20,000 angstrom units thickness to act as a diffusion mask, should be approximately 30,000 angstrom units in thickness.

In order to more fully describe the invention and for no other purpose the body 10 will be described as comprising silicon.

Figure 2:
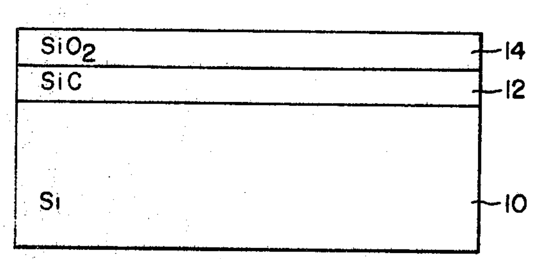

The body 10 and its layer 12 of silicon carbide is next placed in a furnace and heated to approximately 1200° C. in a steam atmosphere produced by such, for example, as oxygen gas bubbled through water heated to approximately 100° C. The process is continued until a layer of silicon carbide approximately 8,000 angstrom units in thickness has been oxidized to a layer 14 of silicon oxide. The resulting structure is shown in FIG. 2.

Figure 3:
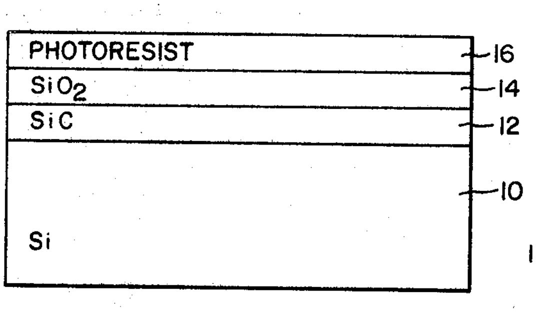

Referring now to FIG. 3 a layer 16 of photoresist material, such, for example, as one available commercially as Kodak Photo Resist, is applied over the layer 16 of silicon oxide.

Figure 4:
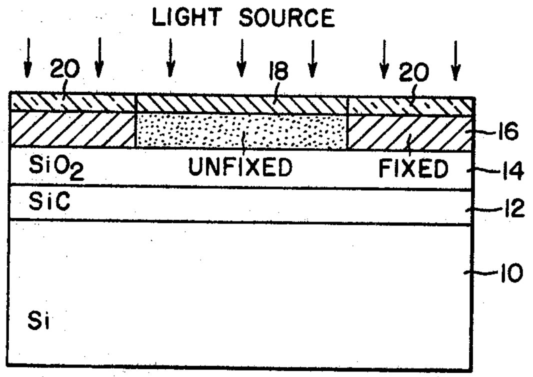

With reference to FIG. 4, a mask with a portion 18 opaque to light and a portion 20 which transmits light is placed on the layer 16 of photoresist. A light source is then directed on the mask and the photoresist material of the layer 16 exposed to the light is "fixed." The photoresist material beneath the opaque portion 20 of the mask remains "unfixed."

Figure 5:
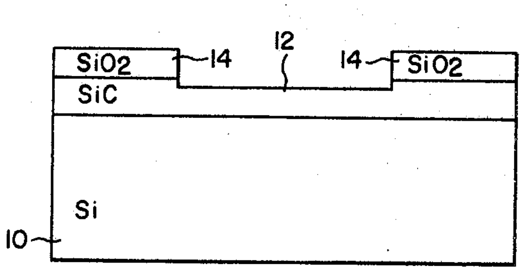

The mask is removed and the "unfixed" photoresist is removed thereby exposing a portion of the silicon oxide layer 14. The exposed silicon oxide material is removed by etching with a solution of 6 parts of concentrated ammonium fluoride, 40% by weight, and 1 part concentrated hydrofluoric acid, 48% by weight, in water to expose a portion of the remaining silicon carbide layer 12 beneath. The remaining photoresist material which acted as a mask is then removed by sulfuric acid heated to 200° C. The remaining portion of the silicon oxide layer 14 disposed between the "fixed" photoresist material and the silicon carbide layer 12 is retained to minimize further oxidation of the silicon carbide layer 12 which is to be retained to act as the diffusion mask. The resulting structure is shown in FIG. 5.

Figure 6:
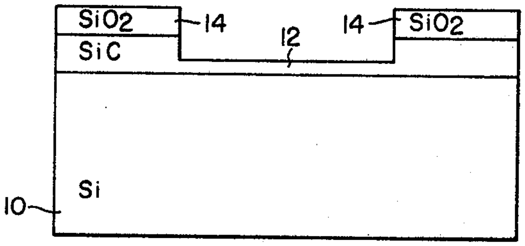
Figure 7:
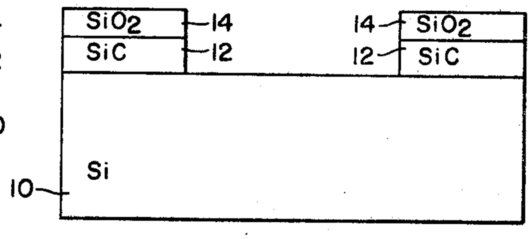

The remaining silicon carbide material to be removed is removed by a series of masking, oxidation, and selective etching process steps which are repeated as often as is necessary until the surface of the body 10 of silicon beneath the silicon carbide layer 12 is reached. The resulting structure after each series of process steps is shown in FIGS. 6 and 7.

Figure 8:
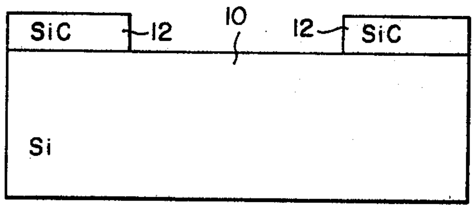

The retained silicon oxide material of the initial silicon oxide layer 14, which protected the silicon carbide material to be retained as a diffusion mask by minimizing further oxidation of the layer 12 during the repeated oxidizing steps, may now be removed as shown in FIG. 8 or it may be retained (FIG. 7) which ever is desirable. In many instances the remaining silicon oxide and the silicon carbide mask will not interfere in the end use of the processed body 10. Additionally the silicon oxide does assist the silicon carbide material in masking selected areas of the body 10 during diffusion of impurities into the body 10. If the silicon oxide must be removed, it is removed by chemical etching in the same manner as practiced before in removing silicon oxide material.

Figure 9:
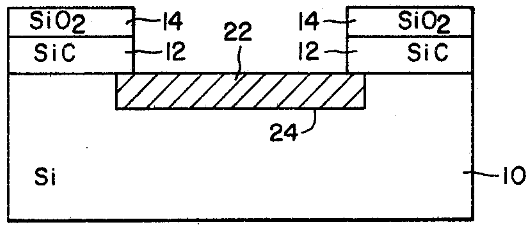
Figure 10:
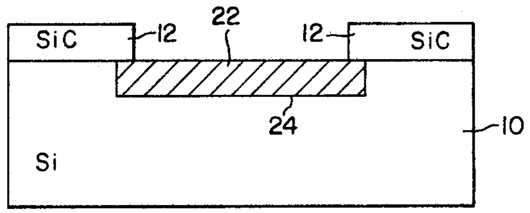

With reference to FIGS. 9 and 10 a suitable dopant such, for example, as boron or phosphorus, is diffused through the recently exposed surface into the body 10 forming a region 22 of doped silicon. The dopant when diffusing into body 10 diffuses a little to the sides as well as penetrating into the body 10. As a result the ends of the boundary, or p-n junction 24, depending on the type of impurity and the semiconductor type oi the body 10, between the region 22 and the remainder of the body 10 of silicon are beneath, and protected by, the silicon carbide layer 12 remaining. FIG. 9 depicts the structure after diffusion and with the silicon oxide layer 14 in place on the silicon carbide masking layer 12. FIG. 10 is illustrative of the structure without the silicon oxide layer 14 but with the silicon carbide masking layer 12.

Figure 11:
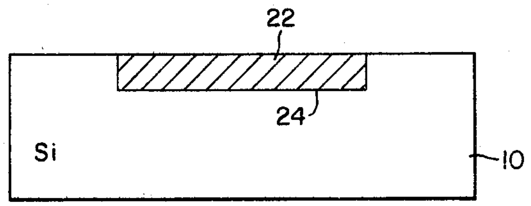
Figure 12:
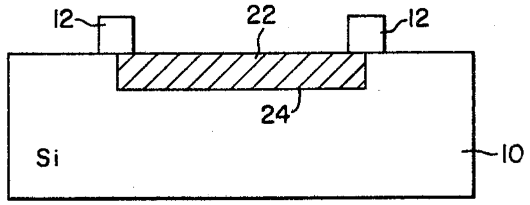

The remaining portions of the original silicon carbide layer 12 may be removed by any suitable means, such, for example, as by the previously practiced process of repeated oxidation, masking, and selective etching of the oxidized silicon carbide material in hydrofluoric acid or a solution of ammonium fluoride and hydrofluoric acid. The resulting structure is shown in FIG. 11. One may also leave just enough of the original silicon carbide to protect the ends of p-n junction 24 when it is exposed to the ambient. The resulting structure is shown in FIG. 12.

The following examples are illustrative of the teachings of this invention.

EXAMPLE I

Two wafers of p-type silicon single crystal semiconductor material were prepared for the growth of silicon carbide on one surface of each wafer. One wafer was lapped and polished to parallelism. The other wafer was only lapped to parallelism.

The two wafers were then placed in a vapor growth apparatus and heated to 1000° C.±10° C. A reactant gas was then introduced into the apparatus and caused to flow over at least one prepared surface of each wafer. The reactant gas was dimethyl-dichloro-silane in nitrogen, of a flow concentration of approximately $10^{-3}$ moles per minute. The reactant gas flow was continued for 30 minutes until a layer at least 20,000 angstrom units in thickness of silicon carbide had been grown on a surface of each wafer.

The wafers were then exposed to an atmosphere of steam and oxygen. Oxygen, flowing at the rate of 2 liters per minute, was bubbled through hot water and caused to flow over the exposed silicon carbide of each wafer for 60 minutes. The exposed silicon carbide layer was oxidized to silicon oxide to a depth of approximately 8,000 angstrom units.

The wafers were removed from the apparatus and a layer of photoresist material was applied over the silicon carbide layer on each wafer. Duplicate masks were placed on the photoresist material and each wafer was exposed to a light source to "fix" the photoresist material in those areas where the silicon carbide was to be retained. The "unfixed" photoresist material was removed exposing a portion of the silicon oxide layer on each wafer. The portion of the silicon oxide layer not protected by the photoresist material was removed by etching with a solution of 6 parts of concentrated ammonium fluoride, 40% by weight, and 1 part concentrated hydrofluoric acid, 48% by weight, in water.

The photoresist material mask was removed by etching in sulfuric acid heated to 200° C.

The silicon oxide protected by the mask was retained on the silicon carbide.

The process steps of oxidation of exposed silicon carbide to silicon oxide, masking, and selective etching were repeated several times until all of the silicon carbide material disposed on a predetermined portion of each of the silicon wafers was removed, thereby exposing a portion of the surface of the silicon wafer.

The remaining silicon oxide of the initial silicon oxide layer was retained during the repeated process steps in order to minimize the further oxidation of the silicon carbide to be retained as a diffusion mask. After the predetermined portion of each silicon wafer was exposed, the remainder of the initial silicon oxide layer was removed by chemical etching. This silicon oxide was removed in order to determine the effectiveness of the silicon carbide material layer as a diffusion masking material.

The wafers were then diffused with phosphorus which entered the wafers through the recently exposed surface areas. The diffusion process employed phosphorus oxychloride as a source heated to 30° C. which was transported across the wafers heated to 1200° C.±1° C. by oxygen for 45 minutes.

Each wafer was examined physically and electrically. The examinations showed that phosphorus had been diffused into each wafer only in the areas not protected by the silicon carbide layers to a depth of 8 microns. It was found that the diffused region extended under each edge of the silicon carbide layer. No diffusion occurred in each wafer under the silicon carbide layer except for the amount occurring under the edges adjacent to the diffused region. An electrical check employing point probes revealed rectification occurring between the diffused region and points on the wafer surface which had been protected by the silicon carbide. The results of the diffusion process was the same with both the polished and the lapped surfaces.

The results obtained showed that silicon carbide can be used effectively as a masking agent and the wafers to be diffused do not require a polished surface.

EXAMPLE II

Two wafers of p-type silicon single crystal semiconductor material were prepared in the same manner as the two wafers in Example I.

Employing the same process as described in Example I, a layer of silicon carbide, 30,000 angstrom units in thickness, was grown on the lapped surface of the one wafer. A portion of the silicon carbide layer was removed to expose a portion of the surface of the silicon wafer. The remaining silicon carbide layer was between 19,000 and 20,000 angstrom units in thickness.

The second wafer, which had at least one polished surface, had a layer of silicon oxide, 20,000 angstrom units in thickness, grown on the polished surface. Employing a photo-lithographic technique and the same etching solution as before, a portion of the silicon oxide layer was removed to expose a portion of the silicon wafer beneath. The silicon oxide on the silicon carbide mask was also removed in the same manner as in Example I.

Both wafers were then placed in a diffusion apparatus. The source of diffusion material comprised ammonium phosphate which was heated to 800° C. The wafers were heated to 1200° C. ±1° C. and oxygen gas was employed to transport the ammonium phosphate material across the exposed portions of the silicon wafers and their respective masking layer. Phosphorus was produced by a chemical reaction and deposited on the surfaces of the wafer and diffused into the wafer. The process was continued for 45 minutes.

The wafers were removed and examined physically and electrically. The lapped wafer having the silicon carbide as a masking layer had a phosphorus diffused region of n-type semiconductivity 8 microns deep in the vicinity of the wafer not protected by the silicon carbide. The diffused region extended slightly under the masking layer. Electrical checks showed the existence of a p-n junction, the ends of which were protected by the silicon carbide layer. No other portions of the wafer under the silicon carbide layer had experienced diffusion.

Examination of the second wafer wherein silicon oxide masked a portion of the polished surface the results were different. It was hard to determine where the masking layer ended and the wafer began. Also the diffused region was not isolated. The silicon oxide protected layer of silicon was converted to n-type silicon. The p-n junction depth beneath the original masking layer of silicon oxide was approximately the same as the junction depth beneath the unmasked portion of the wafer — approximately 8 microns. An electrical check with point probes on the unmasked surface of the wafer and a portion which had to be masked by silicon oxide resulted in a direct short circuit.

It was clearly evident therefore that the silicon carbide is an effective masking material for selective diffusion of silicon employing ammonium phosphate as a source of the impurity material.

Since certain changes may be made in the above process and different embodiments of the invention could be made without departing from the scope thereof, it is intended that all matter contained in the above description or shown in the accompanying drawings should be interpreted as illustrative and not in a limiting sense.

We claim as our invention:

1. A selective diffusion process comprising
(a) masking a predetermined surface area of at least one surface of a body of semiconductor material with at least a layer of silicon carbide contiguous with said predetermined surface area; and
(b) diffusing an impurity material through the unmasked areas of the surface of said body to a predetermined depth to form a diffused region comprising the diffused impurity in said body.

2. A selective diffusion process of claim 1 in which the process of masking at least one surface of said body comprises
(a) depositing a layer of silicon carbide on at least said one surface of said body;
(b) oxidizing at least that portion of said silicon carbide layer deposited on all but the predetermined areas of said surface of said body to silicon oxide;
(c) chemically etching away said silicon oxide with a fluoride bearing compound to expose said surface of said body.

3. The selective diffusion process of claim 2 in which the depositing of silicon carbide is by thermal growth from a reactant gas mixture consisting of a gas selected from the group consisting of nitrogen, argon, helium, neon, xenon and a material selected from the group consisting of methylsilane and halogenated methylsilane.

4. The selective diffusion process of claim 3 in which said masking layer of silicon carbide has a thickness of at least approximately 10,000 angstrom units before diffusion.

5. The selective diffusion process of claim 3 in which said masking layer of silicon carbide has a thickness of at least approximately 20,000 angstrom units before diffusion; and
the impurity being diffused is phosphorus derived from a source of ammonium phosphate.

6. The selective diffusion process of claim 4 including forming a layer fo silicon oxide on said masking layer of silicon carbide.

7. The selective diffusion process of claim 5 including forming a layer of silicon oxide on said masking layer of silicon carbide.

8. The selective diffusion process of claim 5 in which the impurity material is phosphorus and including
heating the impurity material source comprising ammonium phosphate to an elevated temperature;
heating said body of semiconductor material to an elevated temperature; and
causing a gas selected from the group consisting of nitrogen and oxygen to flow first across the impurity material source and thence across said heated surface for a predetermined period of time.

9. The selective diffusion process of claim 4 including diffusing an impurity material selected from the group consisting of phosphorus and boron through the unmarked areas of the surface of said body.

References Cited

UNITED STATES PATENTS

| | | | |
|---|---|---|---|
| 3,157,541 | 11/1964 | Heywang | 148—174 |
| 3,228,812 | 1/1966 | Blake | 148—187 |
| 3,398,033 | 8/1968 | Haga | 156—17 |
| 3,406,049 | 10/1968 | Marinace | 148—175 |

L. DEWAYNE RUTLEDGE, Primary Examiner

R. A. LESTER, Assistant Examiner

U.S. Cl. X.R.

117—201; 148—175, 188; 156—17